United States Patent [19]

Dalal et al.

[11] 4,379,832

[45] Apr. 12, 1983

[54] METHOD FOR MAKING LOW BARRIER SCHOTTKY DEVICES OF THE ELECTRON BEAM EVAPORATION OF REACTIVE METALS

[75] Inventors: Hormazdyar M. Dalal; John J. Lowney, both of Wappingers Falls, N.Y.

[73] Assignee: International Business Machines Corporation, Armonk, N.Y.

[21] Appl. No.: 297,642

[22] Filed: Aug. 31, 1981

[51] Int. Cl.[3] .......................... G03C 5/00; B05D 3/06; B05D 5/12; B05D 1/32
[52] U.S. Cl. .................................... 430/315; 427/36; 427/42; 427/84; 427/91; 427/259; 427/124; 430/324; 430/328
[58] Field of Search ...................... 430/315, 324, 328; 427/36, 42, 84, 91, 124, 250, 259

[56] References Cited

U.S. PATENT DOCUMENTS

| 3,874,922 | 4/1975 | Mickelson | 252/512 |
| 4,004,044 | 1/1977 | Franco et al. | 156/659.1 |
| 4,215,156 | 7/1980 | Dalal et al. | 427/84 |
| 4,238,525 | 12/1980 | Aichert et al. | 427/42 |

OTHER PUBLICATIONS

"Magnetic Liquid Crystalline Compositions," O'Hern et al., *IBM Techn. Disclosure Bull.,* vol. 13, No. 8, 1/1971, p. 2265.
"Controlling Interfacial Compositions . . . ," Cuomo et al., *IBM Techn. Disclosure Bull.,* vol. 17, No. 4, 9/1974, p. 1215.
"Multiple Hearth Evaporation . . . ," Geddings et al., *IBM Techn. Disclosure Bull.,* vol. 20, No. 1, 6/1977, p. 180.
"Tantalum Schottky Barrier Diodes," Havas et al., *IBM Techn. Disclosure Bull.,* vol. 22, No. 1, 6/1979, p. 90.
"Resist Stabilization by Electron Beam," Canavello et al., *IBM Techn. Disclosure Bull.,* vol. 22, No. 5, 10/1979, p. 2134.

*Primary Examiner*—Richard L. Schilling
*Attorney, Agent, or Firm*—Paul C. Scifo

[57] ABSTRACT

A method for making low barrier Schottky devices by the electron beam evaporation of a reactive metal such as tantalum, titanium, hafnium, tungsten, molybdenum, and niobium which is selectively deposited at a semiconductor surface such as n-type silicon using a photoresist mask. The method includes a series of steps during the deposition of the barrier metal for degassing the semiconductor substrate, photoresist mask, reactive metal charge and deposition chamber. More particularly, the method includes steps for preliminarily degassing the substrate, mask and surrounding chamber by infra red heating under vacuum followed by steps for preliminarily degassing the charge and surrounding chamber, while the substrate and mask are shielded by electron beam heating the charge while under vacuum. Thereafter, and prior to deposition, the substrate and mask are finally degassed by irradiation with X-rays produced by electron beam heating the charge to a temperature below evaporation for a predetermined time under vacuum. Upon further heating of the charge, the barrier metal is evaporated and deposited at the semiconductor substrate surface.

10 Claims, 3 Drawing Figures

METHOD FOR MAKING LOW BARRIER SCHOTTKY DEVICES OF THE ELECTRON BEAM EVAPORATION OF REACTIVE METALS

DESCRIPTION

Technical Field Background of the Invention

This invention relates generally to the making of Schottky barrier devices and particularly to an improved method of making low barrier Schottky devices by electron beam evaporating a barrier metal which is deposited at a semiconductor surface using a photoresist mask.

Circuit designers find wide application for Schottky barrier devices. Among other applications, Schottky barrier devices are used in mixer and detector circuits of communication equipment, Gunn effect and Impatt circuits of microwave apparatus and in memory array and logic circuits of electronic data processing equipment.

In electronic data processing memory and logic circuits designers find the low forward voltage characteristics of Schottky devices a particular advantage. They find it can be used to increase circuit speed and reduce power consumption. By placing a Schottky diode in shunt with the collector base junction of a circuit transistor, the low forward Schottky diode voltage can be used to clamp the transistor collector base voltage to a low value and thereby prevent the transistor from saturating when driven into conduction. The result is the transistor is able to recover, i.e. receive subsequent turn on signals, in less time following turn off. Accordingly, circuit speed is increased. Where Schottky diodes are used in memory arrays, their low forward voltage permits lower power consumption when the diodes are held in the conducting state. The result is lower component heating and reduced power requirements. See in this regard U.S. Pat. No. 4,112,314, entitled "Logical Current Switch," granted Sept. 5, 1978 to Gani et al. and U.S. Pat. No. 4,129,790, entitled "High Density Integrated Logic Circuit," granted Dec. 12, 1978 to Gani et al.

Circuit designers also find Schottky devices desirable because they require less integrated circuit "real estate" to embody them as compared, for example, to diffused diodes. Due to the simple structure of Schottky devices, i.e. barrier metal overlaying a semiconductor, they can be built in small areas and packed close together. This amiability to high packing density makes Schottky devices desirable for large scale integration (LSI) and very large scale integration (VLSI) applications where packing density is a principal consideration. See in this regard U.S. Pat. No. 4,170,017, entitled "Highly Integrated Semiconductor Structure Providing A Diode-Resistor Circuit Configuration" granted Oct. 2, 1979 to Klein et al. and U.S. Pat. No. 4,129,790, supra.

The direction of data process equipment development today is to increasingly higher speeds and smaller sizes. This trend translates to a need for yet higher speed circuits having lower power consumption and higher packing densities. Accordingly, this trend has broadened the appeal of Schottky barrier devices. In particular, it has made so-called "low barrier" Schottky devices most desirable. Low barrier Schottky devices exhibit an even lower forward voltage characteristic, (e.g. 0.6 V at 1 milliamp and 10 square micron area) than so-called high barrier Schottky devices which exhibit a higher forward voltage characteristic, (e.g. 0.9 V at 1 milliamp and 10 square micron area). Because the lower barrier Schottky devices have a lower forward voltage, they are even more effective at increasing circuit speed and reducing power consumption. See in this regard "Advances in Solid State Logic—A New Approach to Bipolar LSI:$C^3L$," 1975 IEEE International Solid State Circuit Conference, Digest of Technical Papers, page 168–169.

As noted, there is a continuing desire by circuit designers to shrink the size of data processing equipment. Circuit designers therefore seek to achieve the highest component packing density possible. With continuing increased packing density, however, component metallization is required to be defined more precisely, i.e. line widths and line spacing for components must be made smaller and more precise. This has placed increasing demands on photolithographic etching techniques used to define device geometry.

To answer the need for increasing accuracy, alternative methods to photolithographic etching to define device metallization have been developed. A particularly successful technique, termed "lift-off mask," is described in U.S. Pat. No. 4,004,044, entitled "Method for Forming Patterned Films Utilizing a Transparent Lift-Off Mask" granted Jan. 18, 1977 to Franco et al. and U.S. Pat. No. 3,873,361, entitled "Method of Depositing Thin Film Utilizing A Lift-Off Mask" granted Mar. 25, 1975 to Franco et al.

The technique described in the two Franco et al. patents feature the formation of a patterned photoresist mask atop the semiconductor surface. The deposition mask is used to facilitate accurate placement of blanket deposited metal layers only at select portions of the substrate surface. Following deposition, the mask is removed, removing with it excess metallization which has deposited at the mask surface. This technique thus eliminates the need for photolithographic back etching to form the device metallization pattern.

The lift-off technique is therefore desirable for making LSI and VLSI integrated circuits and accordingly desirable for uses in making Schottky barrier devices in such environments.

Unfortunately, however, manufacturers have encountered difficulty in making low barrier Schottky devices using lift-off deposition masks. Low barrier schottky devices can be made on n-type silicon using a variety of reactive metals as the barrier metal. Particularly, workers have used reactive metals such as tantalum, titanium, hafnium, tungsten, molybdenum, and niobium to successfully make Schottky devices of p-type silicon. These metals, however, have high evaporation temperatures. Their evaporation temperatures are typically so high as to prevent the metal from being conveniently evaporated in a manufacturing environment. For example, the temperatures required to evaporate these metals are too high to permit use of standard resistance heating.

Sputtering techniques have also proved unsatisfactory. Particularly, where a lift-off mask is used, as required here, use of a sputtering process results in mask erosion and reduced mask accuracy. Additionally, heat generated by the sputtering process causes the photoresist mask to flow and further diminish deposition accuracy.

As an alternative to resistance heating and sputtering, manufacturers have used electron beam heating to facilitate Schottky barrier metal evaporation and deposition in the presence of a lift-off mask. With this technique, an electron beam is used to bombard the reactive metal charge heating it to evaporation. Evaporated metal may thereafter deposit through the lift-off mask at the semiconductor surface without degrading the mask or its accuracy.

Unfortunately, however, difficulties are also associated with the use of electron beam evaporation. X-rays liberated when the electrons of the beam collide with the reactive metal charge are believed to interact with the mask materials. This interaction is believed to liberate contaminates which deposit at the semiconductor surface before and during deposition of the barrier metal. The contaminates are thought to result from X-ray ionization of the photoresist mask constituents. These ionized constituents migrate out of the mask layer and congregate at the semiconductor surface. Depositing barrier metal arriving at the surface traps the ionized mask constituents forming a contamination layer between the barrier metal and the semiconductor surface.

The result is Schottky devices having uncertain barrier heights and associated uncertain forward voltage characteristics, typically higher than expected. Additionally such devices show unstable electrical characteristics over time and when subjected to increased temperature.

To limit the effect of photoresist contaminates at the semiconductor surface, manufacturers in the past have tried to reduce the lift-off mask outgassing during deposition by vacuum baking the mask prior to deposition and further formulating the photoresist to be less photosensitive. For example, see IBM Technical Disclosure Bulletin, Vol. 22, No. 1, June 1979, entitled "Tantalum Schottky Barrier Diodes" by J. Havas and G. Paal, p. 90 and copending U.S. patent application Ser. No. 106,608, entitled "Thin Layer Deposition Process" filed by Carr et al., Dec. 26, 1979. However, these efforts have proven unsuccessful in eliminating the presence of contamination between the semiconductor surface and the barrier metal. The consequence is low Schottky barrier devices prepared using electron beam evaporation of reactive metals with lift-off mask have shown poor repeatability and unstable electrical characteristics.

SUMMARY OF THE INVENTION

It is therefore an object of this invention to provide an improved method for making low barrier Schottky devices.

It is a further objective of this invention to provide an improved method for making low barrier Schottky devices using a lift-off deposition mask.

It is yet a further objective of this invention to provide an improved method for making low barrier Schottky devices using a lift-off deposition mask and an electron beam for evaporating the barrier metal to be deposited.

It is still a further object of the present invention to provide an improved method for making low barrier Schottky devices using a lift-off deposition mask and electron beam evaporation of the deposition source which exhibits repeatable and stable electrical characteristics.

Briefly, the improved method of this invention comprises use of a series of steps during the deposition of the barrier metal for degassing the substrate, photoresist deposition mask, metal charge and deposition chamber. To reduce the level of contaminates present this improved method requires the substrate, mask and their chamber be initially infrared heated while under vacuum. Subsequently, the barrier metal charge and its chamber are heated with the substrate shielded to effect a preliminary degas. Thereafter, the substrate and photoresist mask are uncovered and X-ray irradiated while under vacuum for a final degas by electron beam heating the barrier metal charge to a temperature below its evaporation temperature for a period of time before deposition is commenced. Finally, the charge temperature is raised to carry out the evaporation and deposition.

Particularly, the improved method in accordance with this invention comprises placing the semiconductor substrate and associated photoresist lift-off mask in a vacuum chamber together with the reactive metal charge and drawing a vacuum. Thereafter, the substrate, photoresist mask and their surroundings are preliminary degassed by infrared heating. Subsequently, while the substrate and mask are shielded, the reactive metal charge and its surroundings are preliminaryily degassed by electron beam heating the charge under vacuum to a first temperature below the metal evaporation temperature and subsequently to at least a second higher temperature approximately equal to the evaporation temperature and finally to a third temperature substantially higher than the metal's evaporation temperature. This heating in addition to outgassing the metal charge permits evaporated reactive metal to getter contaminates such as residual gases in the surrounding deposition vessel. The above degassing of the semiconductor, photoresist mask, metal charge and chamber may be repeated several times to further reduce the level of potential contaminates.

Following preliminary degassing, the substrate and mask are X-ray degassed and the barrier metal is deposited. The semiconductor structure and photoresist mask are irradiated under vacuum with X-rays generated by electron beam heating the reactive metal charge to a first temperature below the source evaporation temperature for a predetermined time. Thereafter the reactive metal film is evaporated by further heating the charge with the electron beam to a second temperature approximately equal to the metal's evaporation temperature for a predetermined time and following that yet further heating the charge to a third temperature substantially higher than the metal's evaporation temperature.

The following and other objects, features and advantages of the invention will be apparent from the following and more detailed description of the preferred embodiments of the invention as illustrated in the accompanying drawings.

DETAILED DESCRIPTION OF THE INVENTION

Figure 1:
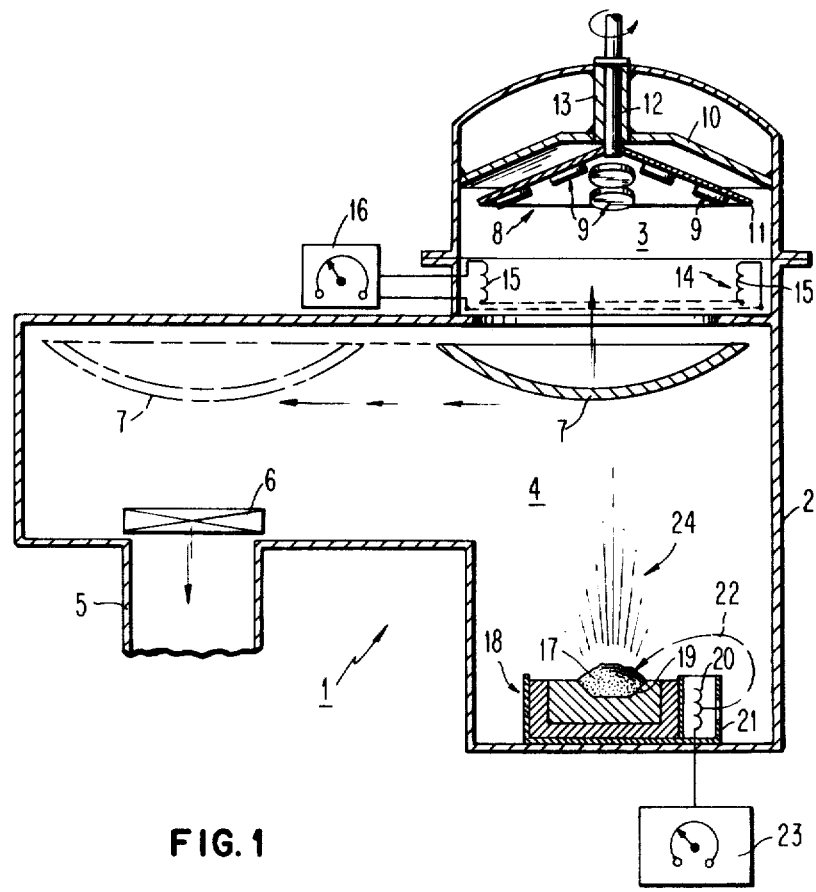
FIG. 1 is a plane view of the apparatus used in the practice of the improved method of this invention.

As explained in the description of the background of the invention, a preferred technique for accurately depositing metal films and achieving narrow line width metallization patterns in large scale and very large scale integrated circuits is the so-called lift-off technique. The technique achieves high deposition dimensional accuracy and permits use of narrow line widths by eliminating the need to photolithographically back etch blanket deposited metal to form the final metallization pattern. With the lift-off technique, rather than photolithographic back etching to finalize the metallization pattern, a deposition mask is used to accurately deposit metal selectively at the semiconductor surface.

As described in the U.S. Pat. No. 4,004,044, Franco et al. supra, the lift-off mask is made of multiple photoresist layers which have been selectively patterned using photolithographic and RF reactive ion etch techniques.

The mask when formed includes a first layer at the semiconductor surface of organic polymeric resist which is overlayed by a second layer of polydimethylsiloxane resin.

During the making of the mask, the polydimethylsiloxane layer and the polymeric layer are etched so that in the regions where openings have been made in the mask to facilitate the desired pattern, the polydimethylsiloxane layer overhangs the polymeric resist layer. This overhang is desired to provide a physical separation between the metal that deposits at the semiconductor surface (through the mask openings) and the metal that deposits at the mask upper surface. The overhang profile assures that when the mask and excess deposited metal are lifted off there is no contact to the metal at the semiconductor surface which will cause the metal at the semiconductor surface to tear away. Optionally, a release agent, for example a polyvinyl formal resin, may be applied to the semiconductor surface before the polymeric layer in order to facilitate ease of mask removal at the completion of the deposition process. See in this regard IBM TDB, Vol. 9, No. 1, June 1966, entitled "Stripping Photoresist Films After Sputter Etching" by Esch and Grantham, pg. 6.

After formation of the deposition mask, any desired metal can be selectively deposited at the semiconductor surface. Where a low barrier Schottky device is desired to be formed on n-type silicon, a suitable barrier metal for forming the device may be selected from the group of reactive metals comprising tantalum, titanium, hafnium, tungsten, molybdenum and niobium.

Because of the high temperature required to melt these metals and the sensitivity of the lift-off photoresist mask to temperature and erosion, of the three principal manufacturing techniques for vacuum depositing metals, i.e. resistance heating, sputtering and electron beam heating, only electron beam heating is suitable for use with the photoresist mask.

As is well known, the temperatures for evaporation of the above noted barrier metals are high. Commonly used manufacturing resistance heating equipment is unsuited for reaching these temperatures. Boat resistance and current supply limitations of commercially available resistance heating evaporation equipment renders such equipment incapable of reaching evaporation temperatures in excess of 1800° C. Accordingly use of such equipment is not possible.

Further sputter techniques are also unsuited for preparing low barrier devices using a lift-off process. The temperature arising in the vacuum chamber and at the semiconductor mask surface during sputtering is typically on the order of 250° C. This temperature is sufficiently high to cause the photoresist of the mask to flow. The result is reduced accuracy at best and at worst, distruction of the mask. Additionally, the etching process associated with sputtering physically erodes the mask, further reducing accuracy and aggravating the potential for mask destruction.

The most suitable manufacturing technique for depositing the barrier metals in a lift-off mask environment is therefore electron beam heating. In the case of electron beam heating, accelerated electrons are directed to collide with the barrier metal charge thereby localizing heating and particle action to the charge. Commercially available electron beam evaporation equipment is capable of producing temperature at the metal charge in excess of 3500° C. Such temperatures are more than adequate to evaporate the metals here involved.

Figure 3:
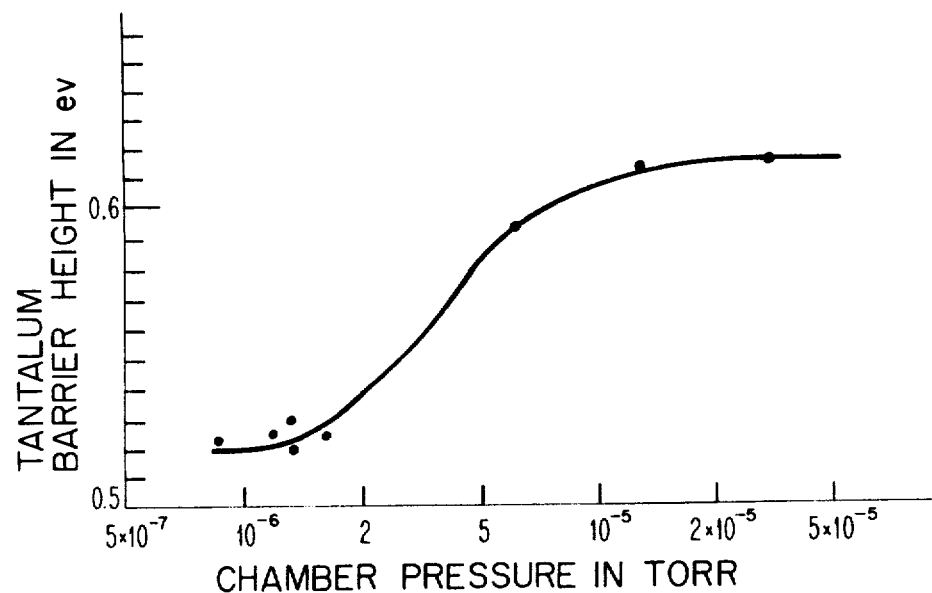
FIG. 3 is a graph of barrier height versus deposition chamber pressure for devices made in connection with the development of the improved method of this invention.

However, even with electron beam heating, difficulties in the fabrication of low barrier Schottky devices are presented. Experiments conducted in connection with this invention have shown that attempts to obtain low barrier semiconductor devices are adversely affected by the presence of contaminates in the deposition chamber. FIG. 3 shows the relationship of deposition chamber pressure to barrier height found when attempts were made to make tantalum low barrier Schottky devices. The chamber pressure corresponds to residual gas pressure within the chamber and accordingly is a measure of the contaminates which may adversely affect the fabricated devices. The higher the chamber pressure, the higher the potential contamination level.

With reference to FIG. 3, it can be seen that where the chamber pressure is lowest, i.e. lowest contamination level, the barrier height obtained is substantially constant and low. Further, with reference to FIG. 3, it can be seen that as chamber pressure increases, i.e. increasing contamination level, the barrier height increases and is subject to greater fluctuation with pressure changes. Finally, where chamber pressure rise still further barrier height also rises and becomes more uniform at the higher barrier height values.

Electrical test of corresponding devices shows forward voltage characteristics for the devices which follow the barrier heights. The lower barrier height devices show low and substantially constant forward voltage characteristics while the higher barrier height devices show higher forward voltage characteristics which are subject to fluctuation with temperature and time. While the above observations were made with respect to tantalum, it is expected the same general relationship would exist for other reactive metals such as titanium, hafnium, tungsten, molybdenum, and niobium.

This understanding of the need to reduce contaminates is not new and is manifested in existing manufacturing practices which call for rigorous cleaning and degassing of the deposition chamber and elements required to be placed in it, e.g. substrate, mask and barrier metal source. See, for example, U.S. Pat. No. 4,214,256 granted July 22, 1980 to Dalal et al.

Attempts to reduce contamination, however, are compromised where the deposition mask is composed of low vapor pressure materials such as those which constitute a photoresist lift-off mask. Accordingly, the tendency of photoresist masks to give off vapors has made them difficult to use for Schottky device manufacture.

Workers in the past have recognized the potential of photoresist masks to produce contamination. They have, therefore, proposed such steps as vacuum baking the mask after formation and before it is used for deposition. See in this regard IBM Technical Disclosure Bulletin, Vol. 22, No. 1, June 1979, p. 90, entitled "Tantalum Schottky Barrier Diodes" by J. Havas and G. Paal. Further it has also been proposed to formulate photoresist masks of materials tending to reduce the masks vapor pressure and to additionally vacuum bake the mask after formation and before use in deposition. See in this regard U.S. patent application Ser. No. 106,608 of Carr et al., entitled "Thin Layer Deposition Process."

This invention recognizes not only the tendency of the photoresist mask following formation to outgas but also the tendency of the deposition process itself to increase mask outgassing. Particularly, this invention recognizes that where electron beam heating is used to evaporate the barrier metal, X-rays are generated which ionize mask constituents, liberating them and thereby aggravating the contamination level, i.e. increase residual gases in the region of the exposed semiconductor surface.

This invention recognizes that the effect of mask constituent ionization and resulting contamination can be reduced if just prior to deposition the semiconductor substrate and mask are X-ray irradiated while under vacuum for a prescribed time period without causing evaporation. Following this period of mask X-ray irradiation the source is further heated using the electron beam to evaporate the barrier metal.

Additionally, this invention recognizes that contaminates arising from other sources within the chamber, as for example residual background gas may adversely effect device barrier height. These residual gases may be reduced by evaporating an amount of barrier metal while the semiconductor and mask are shielded. Because the barrier metal is a reactive metal, it will act as a getter to reduce the level of residual gas in the deposition chamber.

This invention therefore proposes a series of process steps designed to reduce the residual gas level and therefore the likelihood of contamination at the semiconductor surface. Particularly, the improved method requires the semiconductor substrate be loaded into a vacuum chamber with a charge of barrier metal. Following loading the chamber is required to be evacuated to a pressure lower than $4 \times 10^{-7}$ Torr. Thereafter the semiconductor substrate, mask and the surrounding chamber are preliminarily degassed by infrared heating the substrate and mask to a temperature of between 120°-160° C. for between 30 seconds to 5 minutes while the substrate and mask are shielded from the metal charge. Preferably, the substrate and mask are heated to a temperature of approximately 150° C. for approximately 3 minutes.

Following preliminary infrared degassing, with the substrate and mask still shielded from the barrier metal charge, the charge is heated by means of an electron beam. The metal charge is heated to a first temperature of between 800°-1500° C. for between 0.5 to 2.0 minutes. Preferably the charge is heated to 800° C. for a period of 1 minute. Thereafter, the charge is heated to a second temperature of between 2700°-2900° C. for between 0.3 to 0.5 minutes. Preferably it is heated to a temperature of 2700° C. for 0.3 minutes. Finally, the barrier metal charge is heated to a temperature of between 3000°-3500° C. for a period of between 0.3 to 0.5 minutes. Preferably the barrier metal charge is heated to a temperature of 3000° C. for 0.3 minutes.

Following barrier metal degassing, the sequence of substrate-mask degassing and barrier metal heating described may be repeated 2 to 7 times to further degas the system, depending upon the pumping capability of the system, cleanliness of charge and the system, content of ionizable component in lift-off resist masks and total volume of lift-off resist contained on semiconductor substrates. After each sequence of barrier metal heating, the evaporation system is allowed to recuperate to a pressure below $4 \times 10^{-7}$ Torr.

Upon completion of the preliminary degasing sequence, the substrate and mask are exposed to the barrier metal charge for final X-ray degassing and metal evaporation. Particularly the charge is first heated to a first temperature between 800°-1500° C. for between 0.3 to 1.0 minutes. Preferably the charge is heated to a temperature of 800° C. for 1 minute. Thereafter it is further heated to a second temperature between 2700°-2900° C. for 0.1 to 0.5 minutes, preferably 2700° C. for 0.3 minutes. Finally, the charge is heated to a third temperature between 3000°-3500° C. and maintained at that temperature until the barrier metal is fully evaporated and deposited. Preferably the charge is heated to a temperature of 3000° C. and maintained at that temperature for between 5-10 minutes to produce a Schottky barrier contact having a thickness on the order of 500 Å to 2000 Å.

Conventional vacuum deposition apparatus having an electron beam evaporating tool may be used to practice the improved method. FIG. 1 is an illustration of apparatus particularly suited for practicing the improved method. With reference to FIG. 1, deposition apparatus designated generally as 1 includes a vacuum chamber 2 which is subdivided into at least a first subchamber 3 and an adjoining second subchamber 4 which is open to subchamber 3. Subchambers 3 and 4 are designed to be in communication with each other and also with a conventional vacuum pump (not shown) to permit a vacuum to be drawn within the subchambers. A vacuum pump conduit 5 is provided to permit coupling of the subchambers to the vacuum pump. Further, a control valve 6 is provided at conduit 5 to facilitate regulation of the vacuum drawn within the subchambers.

Subchambers 3 and 4 are configured so that while adjoining and open to one another, they may be controllably isolated. As shown in FIG. 1, a movable shutter 7 is provided for that purpose. Shutter 7, as shown, is movably mounted between the two subchambers so that in a first position (shown in phantom) subchamber 3 is in full and complete communication with subchamber 4. Additionally, shutter 7 is movable to a second position (shown solid lined) in which events occurring in subchamber 4 are isolated from subchamber 3.

Included in subchamber 3 is a mounting table 8 suitable for receiving and holding a plurality of individual semiconductor substrates 9. Mounting table 8 is rotatably and centrally mounted in subchamber 3 by means of support member 10 which itself is affixed to subchamber 3's side walls as shown. In the preferred form shown, table 8 includes a mounting plate 11 and a drive shaft 12. Plate 11 is circular and adapted to receive and hold a plurality of substrates 9 in an inverted position at radial and angular positions on the plate. Substrates 9 may be removably mounted to the plate 11 in any conventional manner. With this configuration, evaporated metal entering subchamber 3 from subchamber 4 may deposit at the upper surface of the individual semiconductor substrate.

Drive shaft 12 is centrally located in plate 11 and journaled in a bearing 13 of support member 10. Shaft 12 is further arranged to protrude through the upper wall of subchamber 3 where it may be coupled to a drive means (not shown). Table 8 is arranged in this way so it may be rotated in subchamber 3 during deposition to assure uniformity of metal distribution among substrates 9.

Also included in subchamber 3 is an infrared heater 14 for heating the subchamber and substrates 9. The infrared heater includes multiple heating elements 15 electrically coupled to a controllable power supply 16. As shown, power supply 16 is located externally to subchamber 3 to facilitate ease of operation. The heater may be of a conventional type provided it is capable of heating substrates 9 up to a temperature of 200 degrees centigrade when suitably mounted in subchamber 3.

Still with reference to FIG. 1, subchamber 4 is seen to include a metal charge 17, e.g. tantalum, titanium, hafnium, molybdenum or niobium or some combination thereof, to be evaporated. Charge 17 is located in a crucible 19 of a conventional electron beam evaporating tool 18. An electron beam heating tool suitable for use in practicing the improved method is model CV-14 available from the Airco Temescal Co.

Electron beam heater 18 includes a filament 20 which upon heating generates a supply of electrons. Heater 18 further includes a perforated anode 21 maintained at a positive voltage for forming the electrons supplied from filament 20 into an electron beam 22. Magnetic focusing means (not shown) also included in heater 18 bend the electron beam and focus it upon metal charge 17. Controllable power supply 22 is provided to permit variation of the intensity, i.e., flux and velocity, of the electron beam bombarding charge 17. By increasing the intensity, of beam 21, the temperature of charge 17 can be raised to the metal's evaporation temperature thereby generating a stream of metal atoms 24 which may be deposited at the semiconductor substrates 9.

Figure 2:
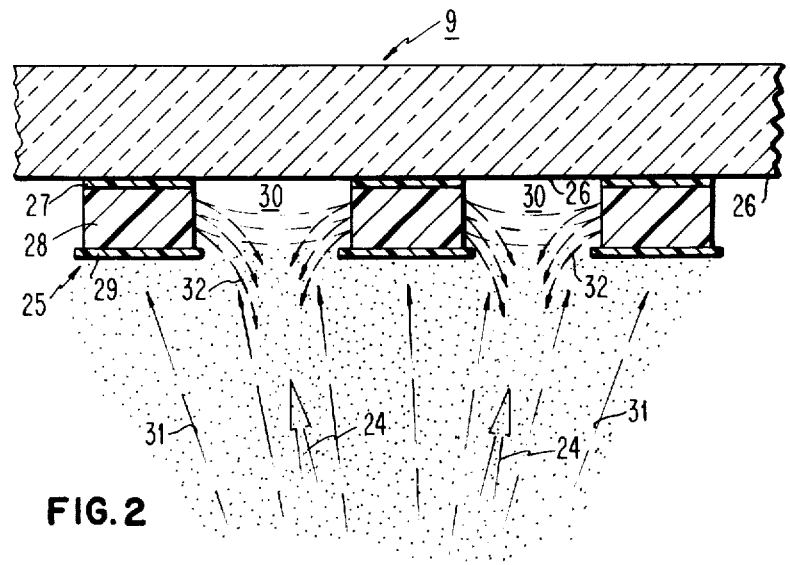
FIG. 2 is a fragmented cross-sectional view of the semiconductor substrate and photoresist deposition mask to which the Schottky barrier metal is to be deposited in accordance with the improved method of this invention.

A cross section of an individual substrate 9 with a patterned lift-off mask 25 thereon is shown in FIG. 2. As seen in the FIG. 2, mask 25 resides at the surface 26 of substrate 9. As described above and as shown in FIG. 2, the mask 25 optionally includes a first layer of release agent 27, as for example, a polyvinyl formal resin at semiconductor surface 26 to permit ease of mask removal following deposition. Atop release agent 27, is the first layer 28 of mask 25, typically organic polymeric resist. Atop layer 28 is the second layer 29 of mask 25, typically polydimethysiloxane resin.

As shown in FIG. 2, in the region 30 where mask 25 has been opened (patterned) to expose semiconductor surface 26, second mask layer 29 overhangs first mask layer 28. As explained above during evaporation and deposition X-rays 31 arising from the electron beam heating of the metal charge 17 ionize constituents of mask 25. These ionized constituents 32 migrate out of the mask and congregate at the pattern mask openings 30. During deposition the stream of evaporated metal atoms 24 traps the ionized constituents at surface 26. This trapped contamination results in Schottky devices having high and unstable barrier heights and renders the devices commercially unacceptable.

By using the procedure of this improved method, and in particular, the irradiation of substrates 9 and masks 25 with X-rays generated by electron beam heating metal charge 17 to a temperature below evaporation for a predetermined time before deposition while under vacuum, ionized contamination arising from masks 25 may be drawn away so as to limit their interference with the depositing metal stream 24.

In accordance with this improved method tantalum has been successfully deposited using a lift-off type mask to form low barrier Schottky devices on n-type silicon.

In particular, the steps for depositing the tantalum are as follows. Following the loading of substrates 9 into subchamber 3 and placement of a tantalum charge 17 in electron beam heater 18, subchambers 3 and 4 are pumped down to a vacuum of $4 \times 10^{-7}$ Torr.

After stabilization of subchamber 3 and 4 at $4 \times 10^{-7}$ Torr, subchamber 3 and 4, substrate 9, masks 25 and charge 17 are preliminarily degassed. During the preliminary degas, shutter 7 is positioned to isolate subchamber 3 from subchamber 4, thereby shielding substrates 9 from electron beam heater 18 and metal charge 17. Next, infrared heater 14 is activated to degas subchamber 3, substrates 9 and masks 25. During this step, the temperature in the region of substrates 9 is raised to approximately 150 degrees centigrade for approximately 3 minutes.

Following preliminary degas of subchamber 3, substrates 9 and masks 25 and with shutter 7 still positioned to isolate subchamber 3 from subchamber 4, charge 17 and subchamber 4 are degassed. As noted, reactive metals in the vapor state act as a getter to residual gases, thus subchamber 4 is degased by heating charge 17 to evaporation. Particularly, to degas charge 17 and subchamber 4, electron beam heater 18 is adjusted to raise charge 17 to a first temperature of approximately 800 degrees centigrade and held for approximately 1.0 minutes.

Subsequently, the electron beam is adjusted to raise the source to a second temperature of approximately 2700 degrees centigrade, the approximate evaporation temperature of tantalum, for 0.3 minutes.

Finally, the electron beam heater is further increased to raise the source to a third temperature substantially higher than the tantalum evaporation temperature, particularly to a temperature of approximately 3200 degrees centigrade for a period of approximately 0.3 minutes. To assure sufficient metal will remain for the required deposition, charge 17 is made large enough to withstand several degassing cycles.

Preferably, the above described preliminary degassing steps are repeated 2 times.

For final degas and deposition, shutter 7 is moved to a position which exposes the substrates 9 and masks 25 to charge 17. With shutter 7 removed, masks 25 are finally X-ray degassed by again adjusting the electron beam heater 18 to raise charge 17 to a temperature of approximately 800 degrees centigrade. Heater 18 is held at that temperature for approximately 1.0 minute. During this time, X-rays generated at charge 17 by the action of electron beam 22 permit masks 25 to be outgassed of X-ray ionizable constituents so as to prevent their interference with subsequently evaporated metal depositing at substrate surface 26.

Following final X-ray degassing, charge 17 is evaporated by further heating it with electron beam heater 18. Particularly charge 17 is heated to a second temperature of approximately 2700 degrees centigrade for approximately 0.3 minutes. Thereafter charge 17 is heated to a third temperature of approximately 3100 degrees centigrade and held for approximately 3 minutes or until approximately 1200 Å thick layer of tantalum have been deposited.

While the invention has been particularly shown and described with reference to preferred embodiments thereof, it will be understood by those skilled in the art that various changes in form and details may be made therein without departing from the spirit and scope of the invention.

We claim:

1. An improved lift-off mask method for applying a reactive metal layer to a major surface of a semiconductor substrate, the method including forming a compound layer of photoresist materials at the semiconductor surface; selectively exposing the photoresist layer to radiation which the photoresist is reactive to; removing portions of the photoresist layer to expose select regions of the substrate surface; depositing at least a first layer of reactive metal at the selectively exposed substrate surface and the photoresist by electron beam evaporation of the reactive metal; and removing the photoresist and reactive metal layer on the photoresist layer; the improvement comprising irradiating the photoresist layer with x-rays generated by heating a charge of reactive metal from which the metal to be deposited is supplied to a temperature below the evaporation temperature of the metal while under vacuum with an electron beam for a predetermined time before depositing the reactive metal.

2. The method of claim 1 wherein additionally the semiconductor substrate, photoresist layer and surrounding vacuum chamber are degassed by infrared heating under vacuum before X-ray irradiation.

3. The method of claim 2 wherein additionally the reactive metal charge and surrounding vacuum chamber are degassed by electron beam heating the charge while under vacuum, before X-ray irradiation of the photoresist.

4. The method of claim 3 wherein the reactive metal charge and surrounding chamber are degassed with the substrate and photoresist layer shielded by heating the source while under vacuum with an electron beam to a first temperature substantially below the metal evaporation temperature for a predetermined time, thereafter further heating the source to a second temperature approximately equal to the metal evaporation temperature for a predetermined time and thereafter yet further heating the source to a third temperature substantially above the metal evaporation temperature for a predetermined time.

5. The method of claim 4 wherein the degas steps are repeated one or more times.

6. The method of claim 4 or 5 wherein the reactive metal for deposition at the semiconductor substrate is generated following X-ray irradiation by heating the charge while under vacuum with an electron beam to a temperature approximately equal to the source evaporation temperature for a predetermined time and to thereafter further heat the charge to a temperature substantially above the charge evaporation temperature for a predetermined time.

7. A method for depositing a reactive metal film at a surface of a semiconductor substrate, the surface being selectively exposed by a photoresist mask thereon, the method comprising:
   a. placing the semiconductor substrate and photoresist mask thereon in a vacuum chamber together with a charge of reactive metal and drawing a vacuum;
   b. degassing the semiconductor substrate photoresist mask thereon and surrounding vacuum chamber by infrared heating;
   c. degassing the reactive metal charge and surrounding vacuum chamber by electron beam heating and charge under vacuum while the semiconductor substrate and photoresist layer thereon are shielded;
   d. further degassing the semiconductor substrate and photoresist mask thereon by irradiating them under vacuum with X-rays generated by electron beam heating the reactive metal charge to a temperature below the charge evaporation temperature for a predetermined time;
   e. and depositing a reactive metal film at the exposed semiconductor surface by heating the charge under vacuum with an electron beam to a temperature sufficient to evaporate the charge.

8. The method of claim 7 wherein the charge and surrounding vacuum chamber are degassed by heating the charge under vacuum with an electron beam to a first temperature substantially below the charge evaporation temperature for a predetermined time, thereafter heating the charge to a second temperature approximately equal to the charge evaporation temperature for a predetermined time and thereafter heating the charge to a third temperature substantially above the charge evaporation temperature for a predetermined time.

9. The method of claim 8 wherein the degas steps are repeated one or more times.

10. The method of claim 8 or 9 wherein the reactive metal is deposited by heating the charge while under vacuum with an electron beam to a temperature approximately equal to the charge evaporation temperature for a predetermined time and to thereafter further heat the charge to a temperature substantially above the charge evaporation temperature for a predetermined time.

* * * * *